(12) United States Patent
Xie et al.

(10) Patent No.: US 10,164,041 B1
(45) Date of Patent: Dec. 25, 2018

(54) METHOD OF FORMING GATE-ALL-AROUND (GAA) FINFET AND GAA FINFET FORMED THEREBY

(71) Applicant: GLOBALFOUNDRIES INC., Grand Cayman (KY)

(72) Inventors: Ruilong Xie, Schenectady, NY (US); Andreas Knorr, Saratoga Springs, NY (US); Julien Frougier, Albany, NY (US); Hui Zang, Guilderland, NY (US); Min-hwa Chi, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/790,216

(22) Filed: Oct. 23, 2017

(51) Int. Cl.
| | | |
|---|---|---|
| H01L 29/423 | (2006.01) | |
| H01L 29/66 | (2006.01) | |
| H01L 29/06 | (2006.01) | |
| H01L 29/49 | (2006.01) | |
| H01L 29/786 | (2006.01) | |
| H01L 27/088 | (2006.01) | |

(52) U.S. Cl.
CPC .... H01L 29/42392 (2013.01); H01L 27/0886 (2013.01); H01L 29/0649 (2013.01); H01L 29/0673 (2013.01); H01L 29/4908 (2013.01); H01L 29/4991 (2013.01); H01L 29/6656 (2013.01); H01L 29/66545 (2013.01); H01L 29/66553 (2013.01); H01L 29/66742 (2013.01); H01L 29/78618 (2013.01); H01L 29/78696 (2013.01)

(58) Field of Classification Search
CPC ......... H01L 29/42392; H01L 29/66742; H01L 29/66545; H01L 27/0886
See application file for complete search history.

(56) References Cited

U.S. PATENT DOCUMENTS

| | | | |
|---|---|---|---|
| 7,560,358 B1 | 7/2009 | Kim et al. | |
| 8,592,295 B2 * | 11/2013 | Sleight | H01L 29/66477 257/13 |
| 9,397,200 B2 * | 7/2016 | Qi | H01L 29/66553 |
| 9,761,722 B1 * | 9/2017 | Jagannathan | H01L 29/785 |
| 2017/0012124 A1 * | 1/2017 | Glass | B82Y 10/00 |

* cited by examiner

*Primary Examiner* — Lex Malsawma
*Assistant Examiner* — Xia Cross
(74) *Attorney, Agent, or Firm* — Yuanmin Cai; Hoffman Warnick LLC (57) ABSTRACT

A method of forming a GAA FinFET, including: forming a fin on a substrate, the substrate having a STI layer formed thereon and around a portion of a FIN-bottom portion of the fin, the fin having a dummy gate formed thereover, the dummy gate having a gate sidewall spacer on sidewalls thereof; forming a FIN-void and an under-FIN cavity in the STI layer; forming first spacers by filling the under-FIN cavity and FIN-void with a first fill; removing the dummy gate, thereby exposing both FIN-bottom and FIN-top portions of the fin underneath the gate; creating an open area underneath the exposed FIN-top by removing the exposed FIN-bottom; and forming a second spacer by filling the open area with a second fill; wherein a distance separates a top-most surface of the second spacer from a bottom-most surface of the FIN-top portion. A GAA FinFET formed by the method is also disclosed.

13 Claims, 11 Drawing Sheets

METHOD OF FORMING GATE-ALL-AROUND (GAA) FINFET AND GAA FINFET FORMED THEREBY

TECHNICAL FIELD

The subject matter disclosed herein relates to gate-all-around (GAA) FinFETs (fin field-effect-transistors) of semiconductors. More specifically, various aspects described herein relate to a method of forming a GAA FinFET and the GAA FinFET formed thereby.

BACKGROUND

FinFET technology has recently seen a major increase in adoption for use within integrated circuits. The FinFET technology promises to provide the levels of scalability needed to ensure that the current progress with increased levels of integration within integrated circuits can be maintained. The basic tenet of Moore's law has held true for many years; essentially that the number of transistors on a given area of silicon doubles every two years.

To achieve the large increases in levels of integration, many parameters have changed. Fundamentally the feature sizes have reduced to enable more devices to be fabricated within a given area. However other figures such as power dissipation, and line voltage have reduced along with increased frequency performance. There are limits to the scalability of individual devices and as process technologies continue to shrink to 20 nm and beyond, it sometimes seems impossible to achieve the proper scaling of various device parameters, especially when it has been found that optimizing for one variable, for instance performance, can result in unwanted compromises in other areas, for instance power. It is therefore necessary to consider other more revolutionary options like a change in transistor structure and processing.

BRIEF SUMMARY

Methods of forming a gate-all-around (GAA) FinFET and the GAA FinFET formed thereby are disclosed. In a first aspect of the disclosure, a method of forming a GAA FinFET includes: forming at least one bi-layer fin on a substrate, the substrate having a shallow trench isolation (STI) layer formed thereon and around a portion of a FIN-bottom portion of the bi-layer fin, the fin having a dummy gate formed thereover, the dummy gate having a gate sidewall spacer on sidewalls thereof; forming a FIN-void and an under-FIN cavity in the STI layer, the FIN-void including a space created by removing all portions of the fin not underneath the dummy gate and the gate sidewall spacer, the under-FIN cavity including a space created by removing the FIN-bottom portion of the fin underneath the gate sidewall spacer; forming at least two first spacers by filling both the under-FIN cavity and the FIN-void with a first fill; removing the dummy gate, wherein the FIN-bottom portion and a FIN-top portion of the bi-layer fin underneath the gate are exposed; creating an open area underneath the exposed FIN-top portion by removing the exposed FIN-bottom portion; and forming a second spacer by filling the open area with a second fill; wherein a distance separates a top-most surface of the second spacer from a bottom-most surface of the FIN-top portion.

A second aspect of the disclosure includes a GAA FinFET including a substrate having at least one bi-layer fin formed thereon; a shallow trench isolation (STI) layer formed on the substrate and around a portion of a FIN-bottom portion of the bi-layer fin; a high-k metal gate (HKMG) around a FIN-top portion of the bi-layer fin, the HKMG not touching any portion of the substrate and the HKMG having a gate sidewall spacer formed on sidewalls thereof; at least two first spacers composed of a first fill, one first spacer being in the STI layer and not underneath the HKMG and the gate sidewall spacer, another first spacer being in the STI layer and underneath the gate sidewall spacer but not underneath the HKMG; a second spacer composed of a second fill, the second spacer being in the STI layer and underneath the HKMG and the FIN-top portion of the fin, a top surface of the second spacer being in contact with a bottom surface of the HKMG; a source adjacent to a first sidewall of the FIN-top portion and a drain adjacent to a second sidewall of the FIN-top portion, the second sidewall being opposite to the first sidewall, the source and the drain being above the STI layer and the first spacers and not touching any portion of the substrate; a first interlayer dielectric (ILD) layer formed on the source and drain, the first ILD layer having a top surface below a top surface of the HKMG; and a second ILD layer formed on the first ILD layer; wherein a distance separates a top-most surface of the second spacer from a bottom-most surface of the FIN-top portion.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to gate-all-around (GAA) FinFETs (fin field-effect-transistors) of semiconductors. More specifically, various aspects described herein relate to a method of forming a GAA FinFET and the GAA FinFET formed thereby.

As noted above, due to ever decreasing device size, it has become necessary to consider a change in integrated circuit transistor structure and processing. One such option is the gate-all-around (GAA) structure. GAA structures can meet the electric requirements of an IC, provide a valuable performance boost, offer additional room for source/drain contacts by shrinking the gate length at a given pitch, and are also easy to produce.

One way to form a GAA FinFET is to have a sacrificial layer (e.g., SiGe) and to remove the sacrificial layer before RMG (replacing the metal gate). However, this approach can form a parasitic channel at the bottom of the gate and either compromise leakage or capacitance parameters of the ultimate device.

A solution to this problem is to form an additional dielectric isolation. However, this would either require a SOI (silicon on insulator) substrate or additional process steps with different sacrificial materials which would increase costs and pose processing challenges.

In contrast to the above, various aspects of the disclosure include a method of forming a GAA FinFET including: (A) forming at least one bi-layer fin on a substrate, the substrate having a shallow trench isolation (STI) layer formed thereon and around a portion of a FIN-bottom portion of the bi-layer fin, the fin having a dummy gate formed thereover, the dummy gate having a gate sidewall spacer on sidewalls thereof; (B) forming a FIN-void and an under-FIN cavity in the STI layer, the FIN-void including a space created by removing all portions of the fin not underneath the dummy gate and the gate sidewall spacer, the under-FIN cavity including a space created by removing the FIN-bottom portion of the fin underneath the gate sidewall spacer; (C) forming at least two first spacers by filling both the under-FIN cavity and the FIN-void with a first fill; (D) removing the dummy gate, wherein the FIN-bottom portion and a FIN-top portion of the bi-layer fin underneath the gate are exposed; (E) creating an open area underneath the exposed FIN-top portion by removing the exposed FIN-bottom portion; and (F) forming a second spacer by filling the open area with a second fill; wherein a distance separates a top-most surface of the second spacer from a bottom-most surface of the FIN-top portion.

Figure 1:
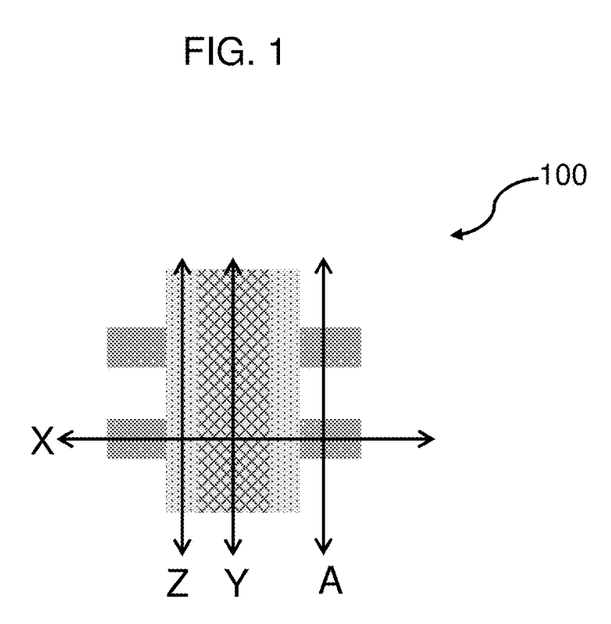
FIG. 1 shows a plan view of a portion of a GAA FinFET with cross-section reference lines X, Y, Z and A indicated.
Figure 2:
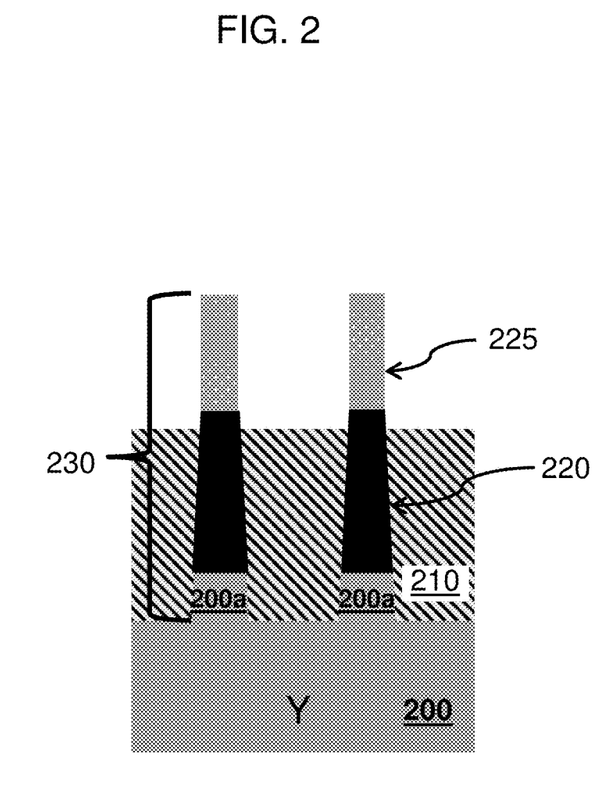
FIG. 2 shows cross-sectional view Y of an initial FIN formation of a GAA FinFET.

FIG. 1 depicts a plan view 100 of a portion of a GAA FinFET with cross-section reference lines X, Y, Z and A indicated therein. Cross-section reference line X refers to a cross-section across the gate and along the FIN. Cross-section reference line Y refers to a cross-section across the FIN and along the gate. Cross-section reference line Z refers to a cross-section across the FIN and along the spacer. Cross-section reference line A refers to a cross-section across the FIN and along the source/drain. FIG. 2 includes cross-section Y only whereas FIG. 3 through FIG. 11 include all cross-sections (i.e., X, Y, Z and A). The cross-sections correspond to those noted by reference lines X, Y, Z and A of FIG. 1.

Referring back to the above-noted portions (A) and (B) of the method of the disclosure (i.e., initial fin formation and forming of a FIN-void and an under-FIN cavity), FIG. 2 through FIG. 5 more specifically show the progressive formation of the FIN-voids and under-FIN cavities.

FIG. 2 (cross-section Y only) depicts initial FIN formation of a GAA FinFET. More specifically, FIG. 2 depicts an initial bi-layer FIN containing structure resulting from: (a) epitaxial growth of a FIN-bottom layer 220 on a substrate 200, followed by epitaxial growth of a FIN-top layer 225 on FIN-bottom layer 220; (b) depositing a hardmask on FIN-top layer 225; (c) patterning the hardmask to define a size and shape of one or more FINs, and etching FIN-top layer 225, FIN-bottom layer 220 and a portion 200a of substrate 200 to form one or more FINs 230; (d) filling spaces around FINs 230 with STI (shallow trench isolation) material to form a STI layer 210; (e) planarizing STI layer 210; (f) recessing (via etching) STI layer 210 to reveal a top portion of FINs 230 (i.e., that portion corresponding to FIN-top layer 225) as well as to reveal an upper section of a bottom portion of FINs 230 (i.e., that portion corresponding to FIN-bottom layer 220); and (g) removing the hardmask.

Substrate 200 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

STI layer 210 can be composed of $SiO_2$ or a combination of dielectric materials such as SiN and $SiO_2$. FIN-bottom layer 220 has a thickness in a range of from about 25 to about 60 nanometers (nm) and can be composed of, for example, SiGe, $SiGe_{50}$, and Ge. FIN-top layer 225 has a thickness in a range of from about 30 to about 100 nanometers (nm) and can be composed of, for example, Si, $SiGe_{20}$ and $Al_{X1}Ga_{X2}In_{X3}As_{Y1}P_{Y2}N_{Y3}Sb_{Y4}$ as defined above.

As can be seen in FIG. 2, FIN 230 is a bi-layer FIN containing both FIN-top layer 225 and FIN-bottom layer 220 sitting on etched portion 200a of substrate 200. Example bi-layer FIN configurations include Si over SiGe, SiGe20 over SiGe50, and $Al_{X1}Ga_{X2}In_{X3}As_{Y1}P_{Y2}N_{Y3}Sb_{Y4}$ over Ge. Embodiments of the disclosure can include any number of FINs 230.

Figure 3:
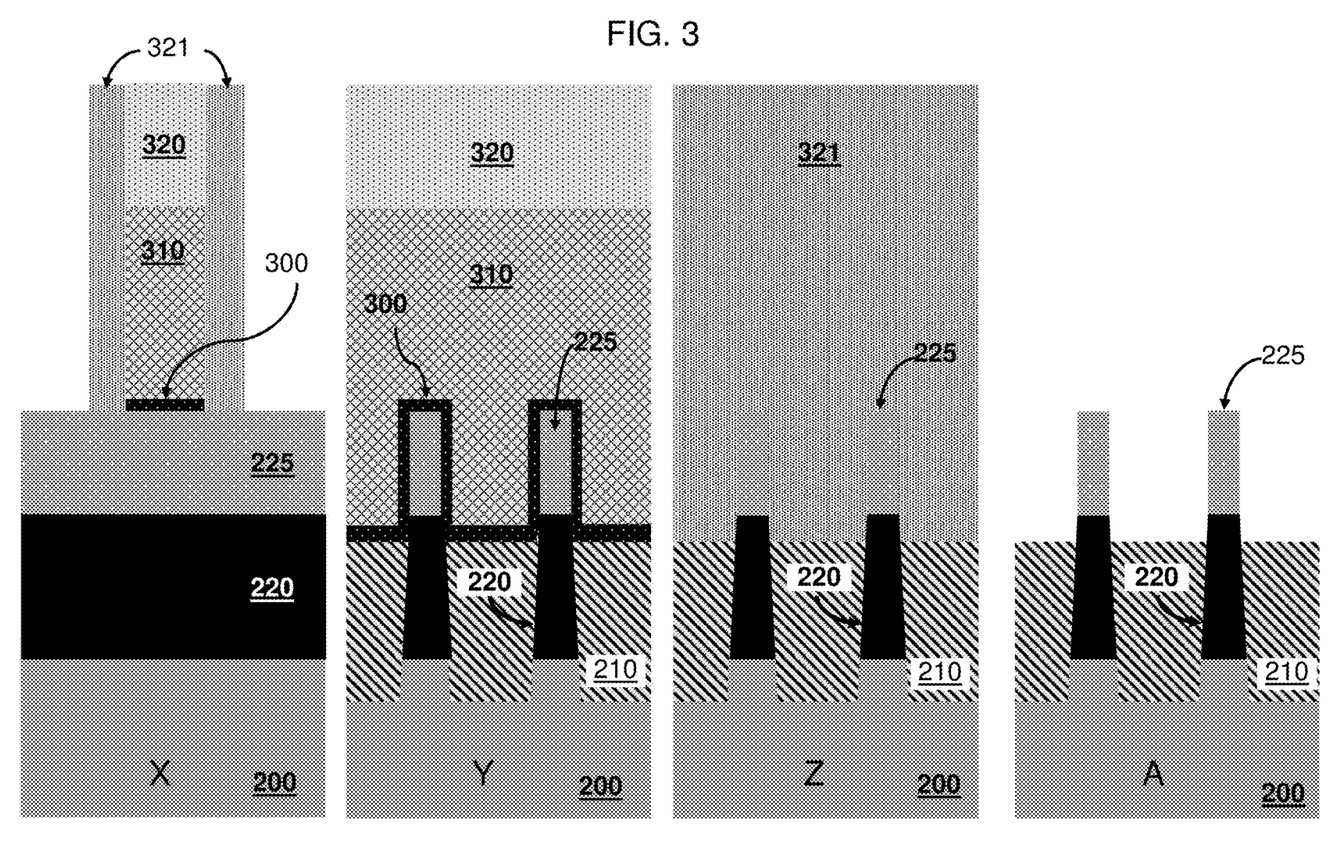
FIG. 3 shows dummy gate and gate sidewall spacer formation.

FIG. 3 depicts dummy gate and gate sidewall spacer formation of a GAA FinFET. More specifically, FIG. 3 depicts an intermediate dummy gate containing structure resulting from: (a) depositing a dummy gate oxide layer 300 on a portion of a top surface of STI layer 210, portions of FIN-bottom layer 220 that are exposed above the top surface of STI layer 210, and portions of FIN-top layer 225 that are exposed (including a top surface of 225); (b) depositing a dummy gate 310 on dummy gate oxide layer 300; (c) planarizing dummy gate 310; (d) depositing a gate hardmask 320 on dummy gate 310; (e) patterning gate hardmask 320 to define a size and shape of dummy gate 310, noting that any portions of dummy gate oxide layer 300 not covered by dummy gate 310 are etched away during this step; and (f) depositing a conformal spacer layer and anisotropically etching the conformal spacer layer to form a gate sidewall spacer 321.

Dummy gate oxide layer 300 can be made of any suitable oxide, for example, $SiO_2$. Dummy gate 310 can be made of any suitable dummy gate material, for example, α-Si. Gate hardmask 320 and gate sidewall spacer 321 may be the same material or may be different materials and may be comprised of any one or more of a variety of different insulative materials, such as $Si_3N_4$, SiBCN, SiNC, SiN, SiCO, $SiO_2$ and SiNOC.

Figure 4:
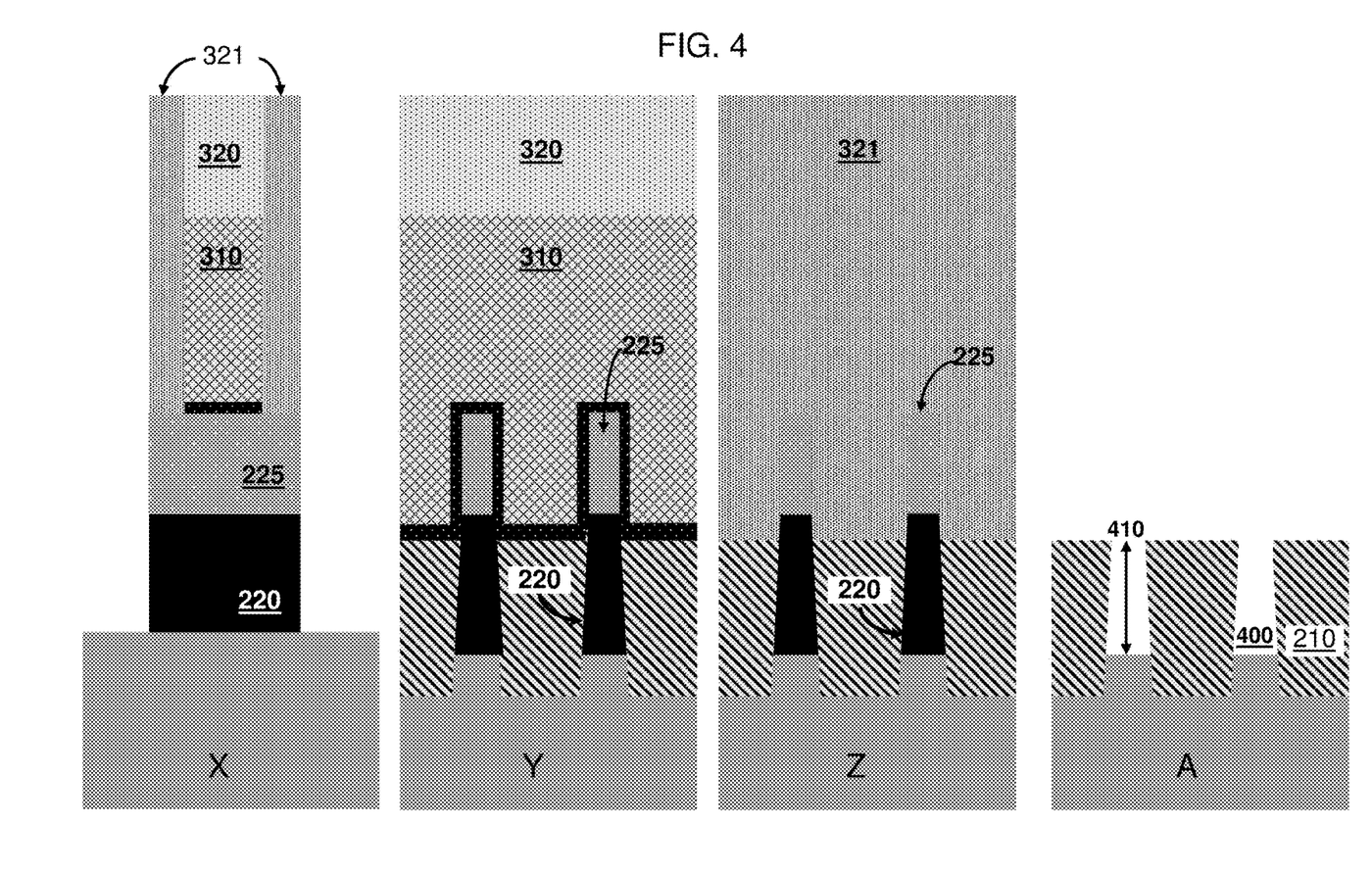
FIG. 4 shows FIN recess and FIN-void formation.

FIG. 4 depicts FIN recess and FIN-void formation of a GAA FinFET. More specifically, FIG. 4 depicts a recessed structure resulting from removing a portion of FIN-top 225 and a portion of FIN-bottom 220, as shown by cross-sections A and X. The top and bottom FIN portions 225, 220 that are removed are those portions that are exposed, i.e. not underneath (or protected by) dummy gate 310 and gate sidewall spacer 321. This FIN recessing is a self-aligned process. Conventionally, FIN portions 225, 220 are only recessed to approximately the top surface of STI layer 210; however, in embodiments of the disclosure, deeper recessing is performed to completely remove bottom FIN portion 220 thereby leaving FIN-void 400. FIN-void 400 has a depth 410 of approximately 20 to 55 nanometers (nm).

Figure 5:
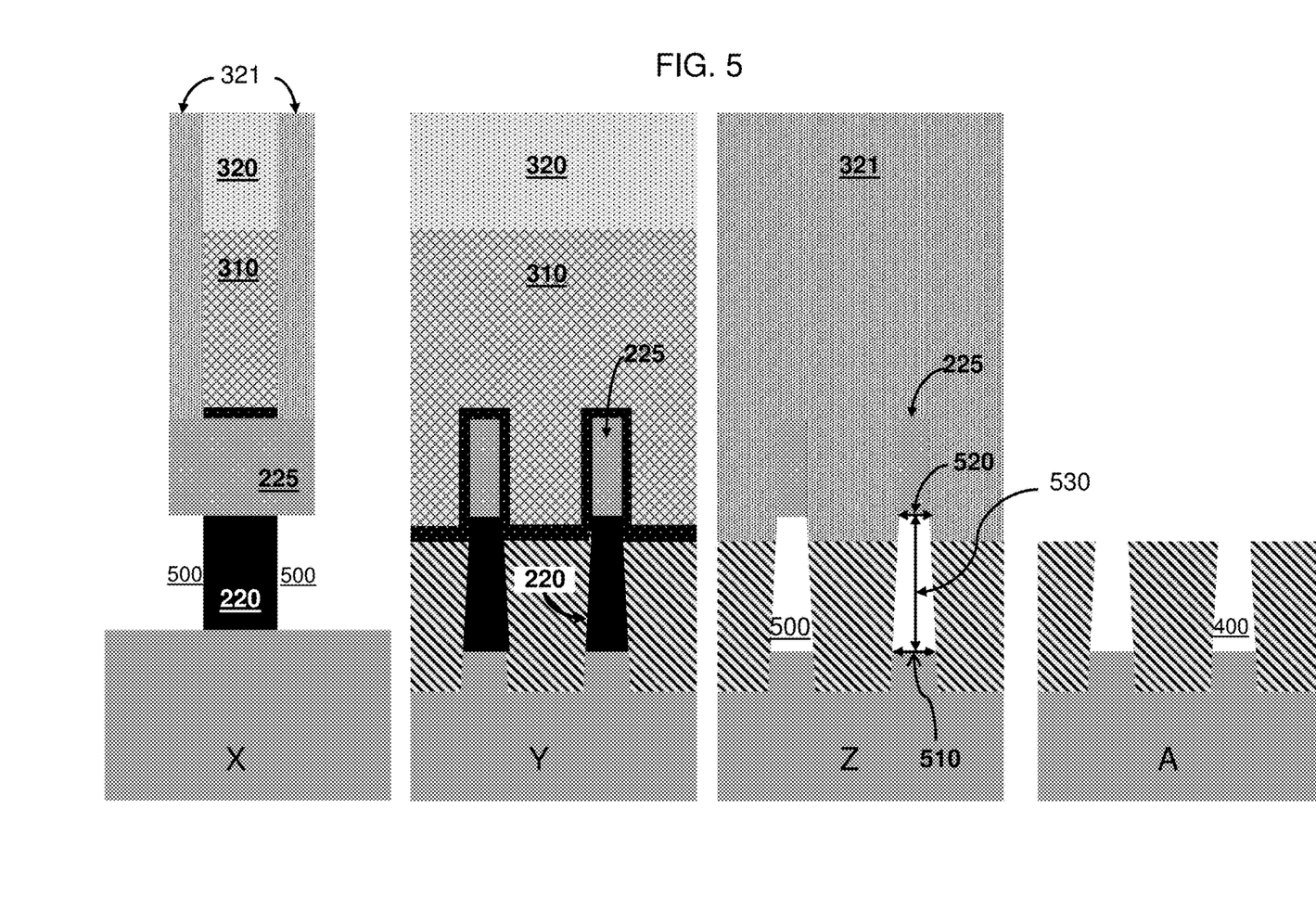
FIG. 5 shows under-FIN cavity formation.

FIG. 5 depicts under-FIN cavity formation of a GAA FinFET. More specifically, FIG. 5 depicts an under-FIN cavity containing structure resulting from removing an additional portion of FIN-bottom layer 220, as shown by cross-sections X and Z. The additional portion of FIN-bottom layer 220 that is removed is that portion which is under gate sidewall spacer 321 but not under dummy gate 310. The removal as shown in FIG. 5 forms at least one under-FIN cavity 500, as shown by cross-sections X and Z. Under-FIN cavity 500 is shown in cross-section Z as being tapered such that under-FIN cavity 500 has a bottom-most width 510 that is greater than a top-most width 520; however, widths 510 and 520 may be approximately equal. Bottom-most width 510 can be about 8 nanometers to about 12 nanometers wide, and top-most width 520 can be about 4 nanometers to about 8 nanometers wide. Under-FIN cavity 500 has a height 530 of approximately 25 to 60 nanometers (nm).

Figure 6:
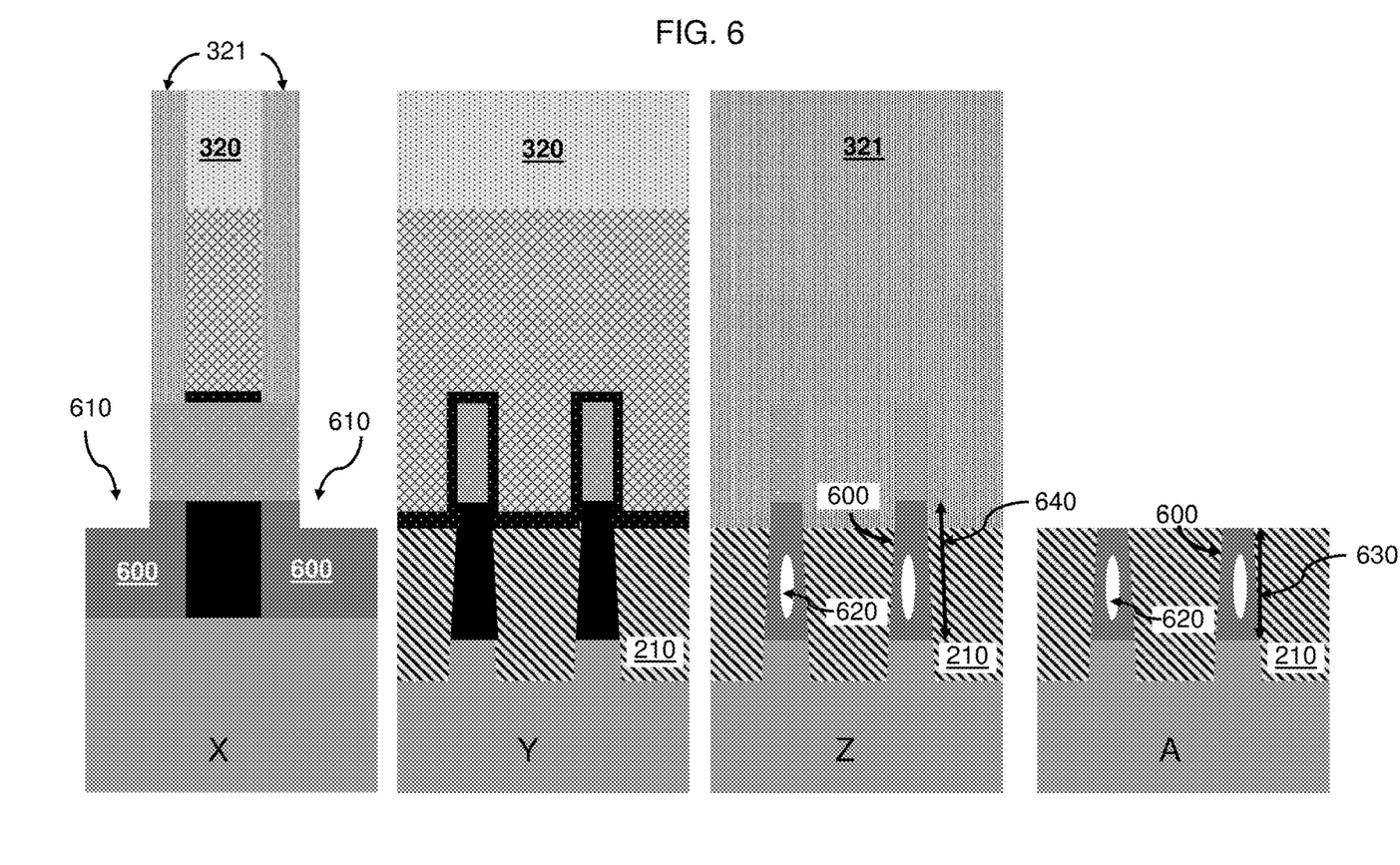
FIG. 6 shows first spacers formation.

As shown in FIG. 6 with multiple cross-sections (i.e., X, Y, Z and A) depicted as labelled in the figure, the above-mentioned (C) forming of the first spacers includes filling FIN-voids 400 and under-FIN cavities 500 with a first fill to form first spacers 600 (see cross-sections X, Z and A) and then isotropically etching back (shown by arrows 610 in cross-section X) first spacers 600 to the top surface of STI layer 210 and to side surfaces of gate sidewall spacers 321. Arrows 610 as shown in cross-section X are an example of the etching extent. Etching can be completed to a lesser or greater extent.

The first fill which forms first spacers 600 can be any suitable dielectric material, and is preferably a nitride based material, for example, SiN, SiON, SiBCN and SiOCN. First spacer 600 has a height 630 (see cross-section A; first spacer formed in the FIN-void) in a range of from about 20 nanometers to about 55 nanometers and a height 640 (see cross-section Z; first spacer formed in the under-FIN cavity) in a range of from about 25 nanometers to about 60 nanometers. Height 640 is greater than height 630. First spacers 600 can have a bottom-most width greater than a top-most width.

FIG. 6 also shows air gaps 620 within first spacers 600 and enclosed thereby. Air gaps 620 are the result of incomplete filling of FIN-voids 400 and under-FIN cavities 500 due to "pinching" caused by the tapered nature of voids and cavities 400, 500. As noted above, voids and cavities 400, 500 may not be tapered as shown and instead may have a top width and a bottom width of approximately equal dimension. In such a case, air gaps 620 may not be formed. Thus, air gaps 620 may be present or may not be present in the GAA FinFET of the disclosure.

Figure 7:
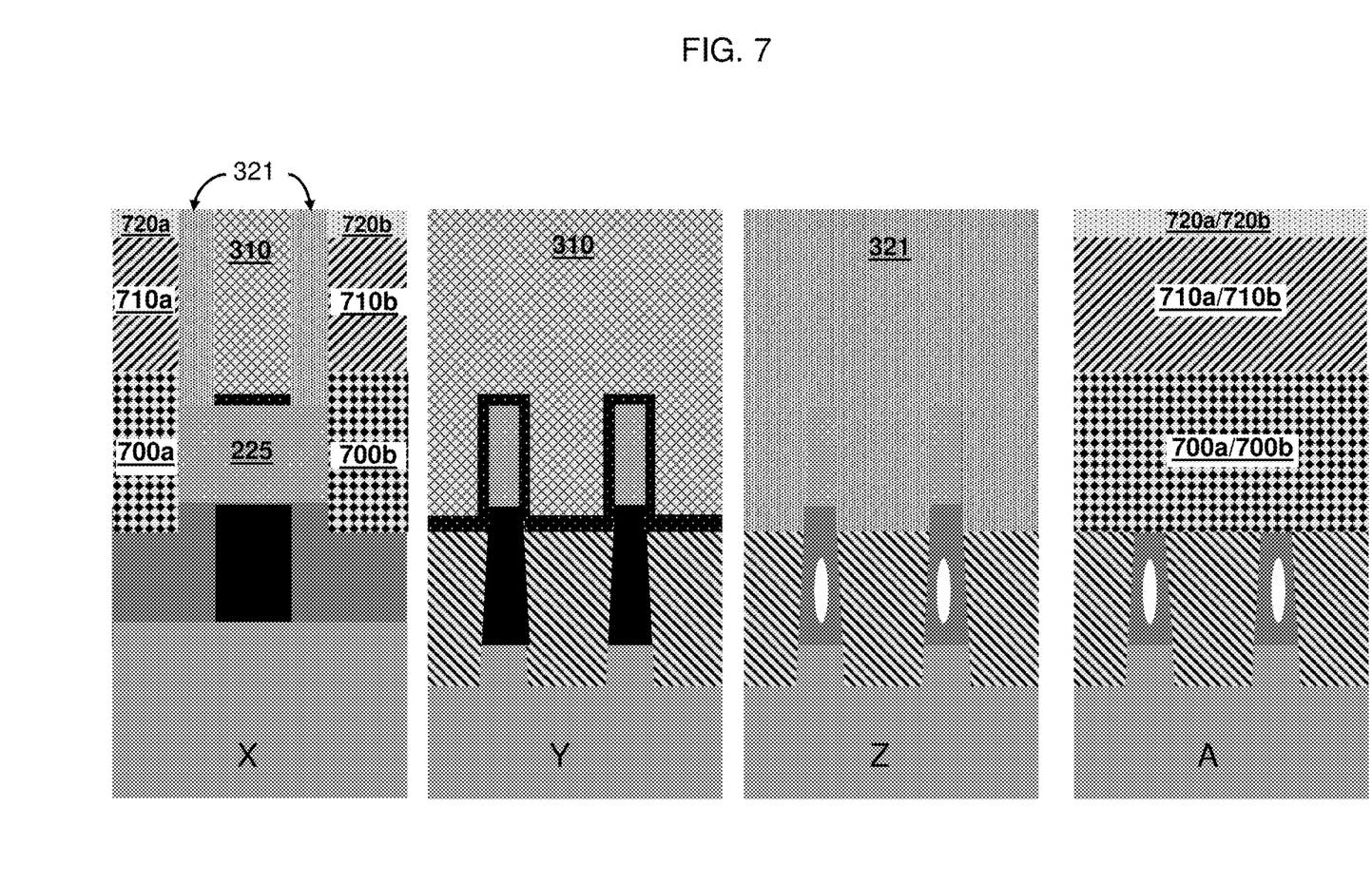
FIG. 7 shows source/drain formation and interlayer dielectric (ILD) fill.
Figure 8:
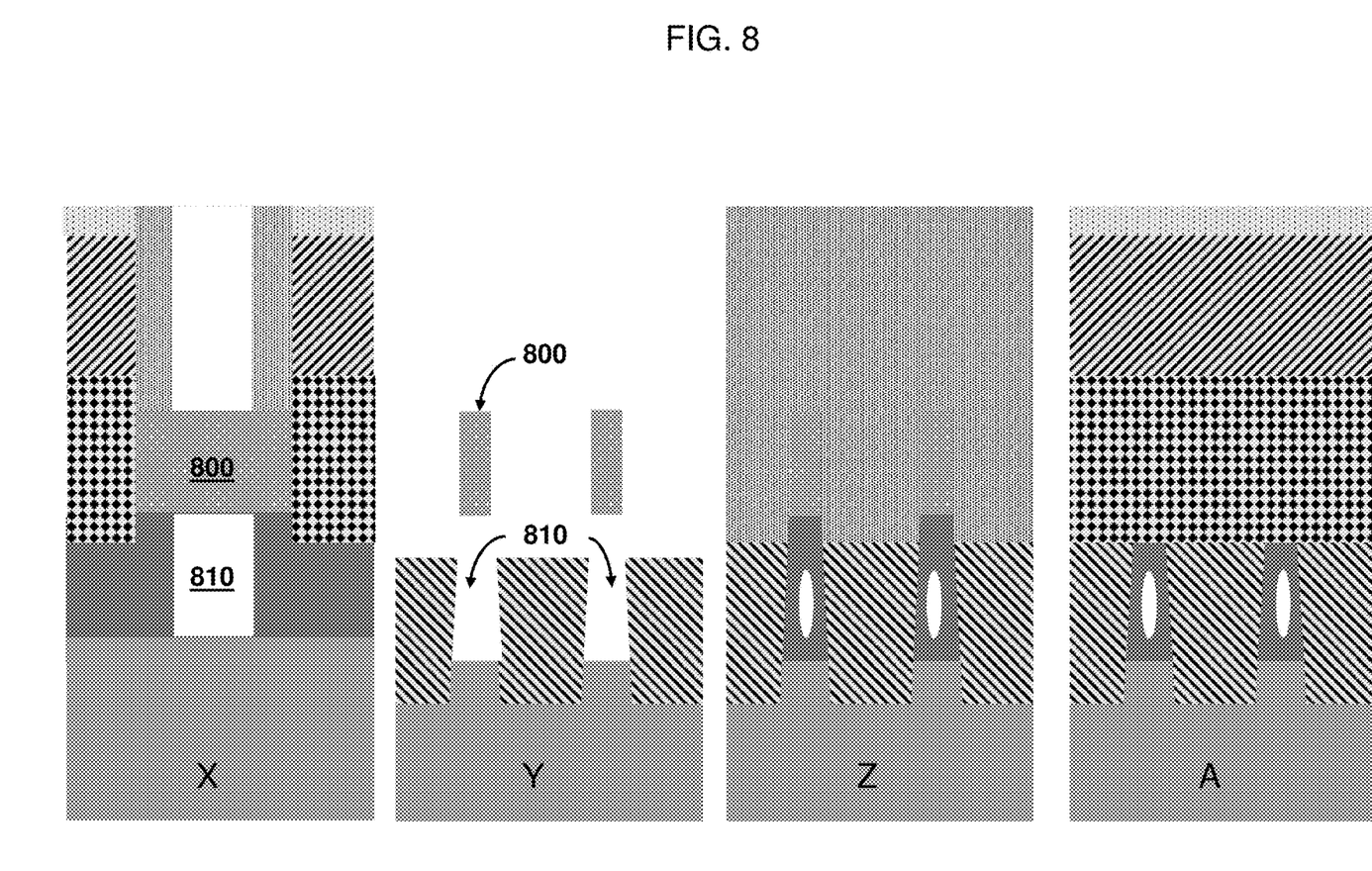
FIG. 8 shows dummy gate and FIN-bottom removal.

After (C) the forming of first spacers 600 but before (D) the removal of the dummy gate, the method of the disclosure may include additional processing as depicted in FIG. 7 and FIG. 8.

FIG. 7 depicts source/drain (S/D) formation and ILD (interlayer dielectric) fill of a GAA FinFET. More specifically, FIG. 7 depicts a S/D and ILD containing structure resulting from: (a) forming a source 700a adjacent to a first sidewall of FIN-top 225 and a drain 700b adjacent to a second sidewall of FIN-top 225, the second sidewall being opposite to the first sidewall and the sidewalls acting as a nucleation site for the epitaxial formation of S/D 700a/700b, wherein S/D 700a/700b are formed above STI layer 210 and first spacers 600, thus rendering S/D 700a/700b fully isolated from substrate 200 (in other words, not touching any portion of substrate 200); (b) depositing on S/D 700a/700b a first interlayer dielectric material followed by planarizing (stopping at gate hardmask 320) and then recessing, such that first ILD layer 710a, 710b is formed on S/D 700a/700b respectively and such that a top surface of first ILD layer 710a, 710b is below a top surface of dummy gate 310; and (c) depositing a second interlayer dielectric material on first ILD layer 710a, 710b followed by planarizing (stopping at dummy gate 310) such that second ILD layer 720a, 720b is formed on first ILD layer 710a, 710b respectively and such that a top surface of dummy gate 310 is exposed through ILD layer 720a, 720b and first ILD layer 710a, 710b is protected by second ILD layer 720a, 720b.

The first interlayer dielectric material of first ILD layer 710a, 710b may be any suitable dielectric material, for example, $SiO_2$. The second interlayer dielectric material of second ILD layer 720a, 720b may be any suitable dielectric material that protects first ILD layer 710a, 710b from being damaged during subsequent processing, for example, SiN. The first and second interlayer dielectric materials may be the same or different.

FIG. 8 depicts (D) dummy gate removal and (E) open area creation via FIN-bottom removal of a GAA FinFET. More specifically, FIG. 8 depicts removing dummy gate 310 and dummy gate oxide 300 such that FIN-bottom 220 and FIN-top 225 underneath dummy gate 310 are exposed (FIN-top 225 that has been exposed is shown as FIN-top 800), followed by creating an open area 810 underneath exposed FIN-top 800 by selectively removing exposed FIN-bottom 220.

Figure 9:
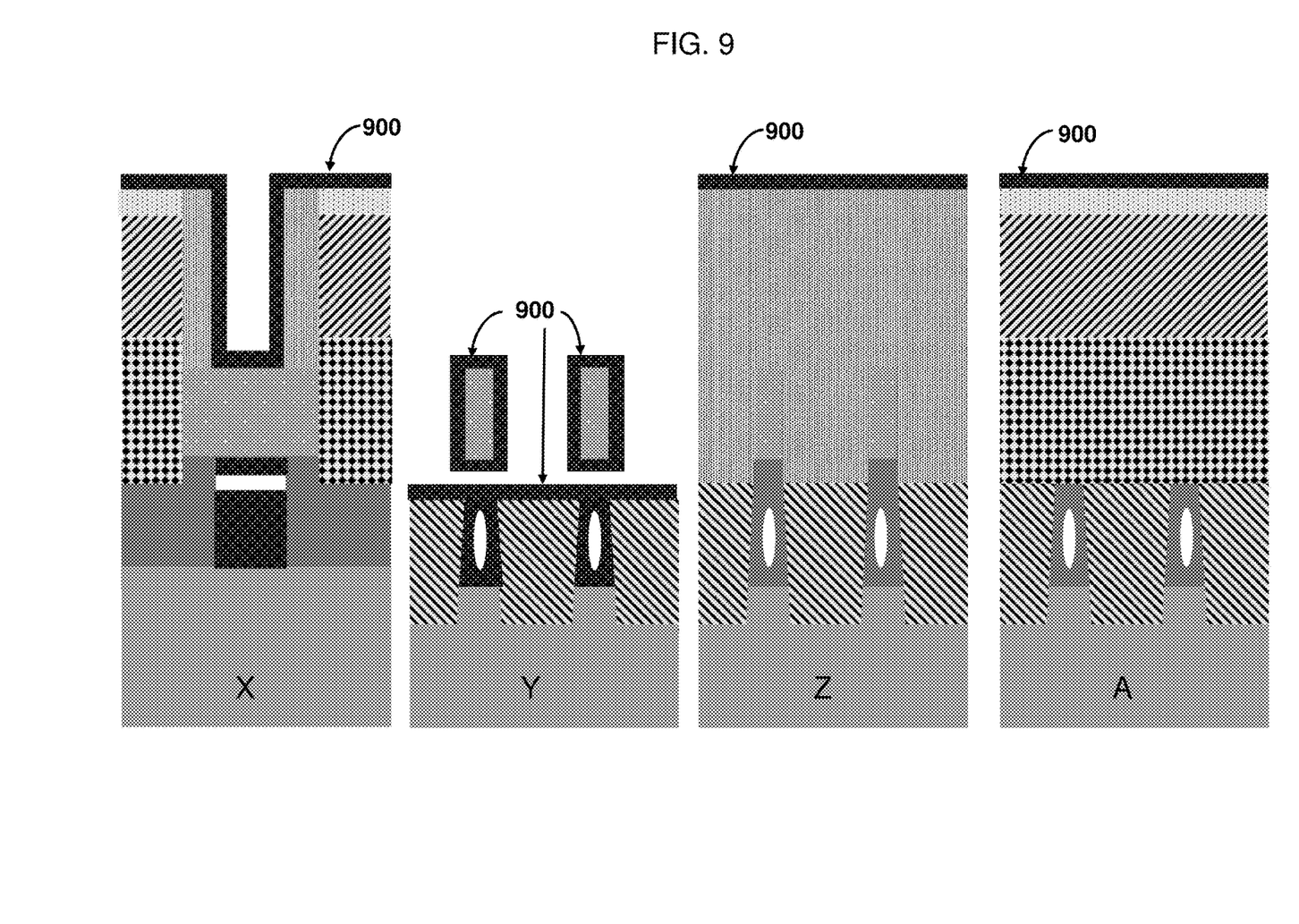
FIG. 9 shows second spacer formation.
Figure 10:
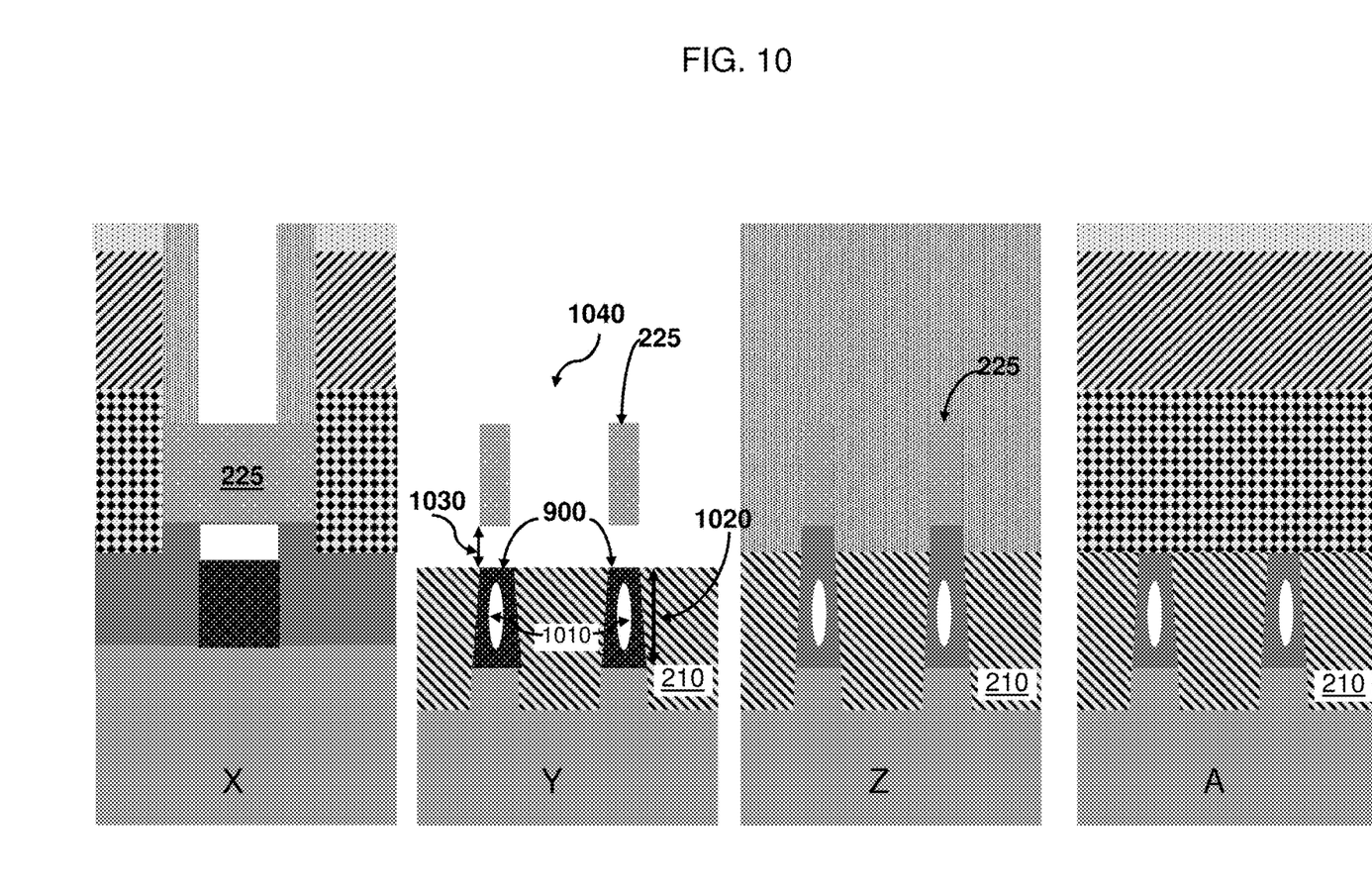
FIG. 10 shows etching back of the second spacer.

Now turning back to (F), the forming of the above-mentioned second spacer, FIG. 9 and FIG. 10 depict such second spacer formation and etch back of a GAA FinFET. More specifically, FIG. 9 depicts filling open area 810 with a second fill to form a second spacer 900, and FIG. 10 depicts etching back second spacer 900 to the top surface of STI layer 210. After etching, a distance 1030 from a top-most surface of second spacer 900 to a bottom-most surface of FIN-top 225, within gate area 1040, is in a range of from about 15 nanometers to about 30 nanometers. Second spacer 900 has a height 1020 in a range of about 10 nanometers to about 30 nanometers. Height 1020 is smaller than height 640 (see FIG. 6), but height 1020 may be equal to, smaller than or larger than height 630 (see FIG. 6). Second spacer 900 can have a bottom-most width greater than a top-most width. The second fill can be any suitable dielectric material and is preferably an oxide based material, for example, $SiO_2$ and SiCO.

FIG. 10 also shows air gaps 1010 within second spacer 900 and enclosed thereby. Air gaps 1010 are the result of incomplete filling of open area 810 due to open area 810 having the same tapered shape as that of voids and cavities 400, 500 previously described. However, as also noted above with respect to voids and cavities 400, 500, open area 810 may not be tapered as shown and instead may have a top width and a bottom width of approximately equal dimension. In such a case, air gaps 1010 may not be formed. Thus, air gaps 1010 may be present or may not be present in the GAA FinFET of the disclosure.

Figure 11:
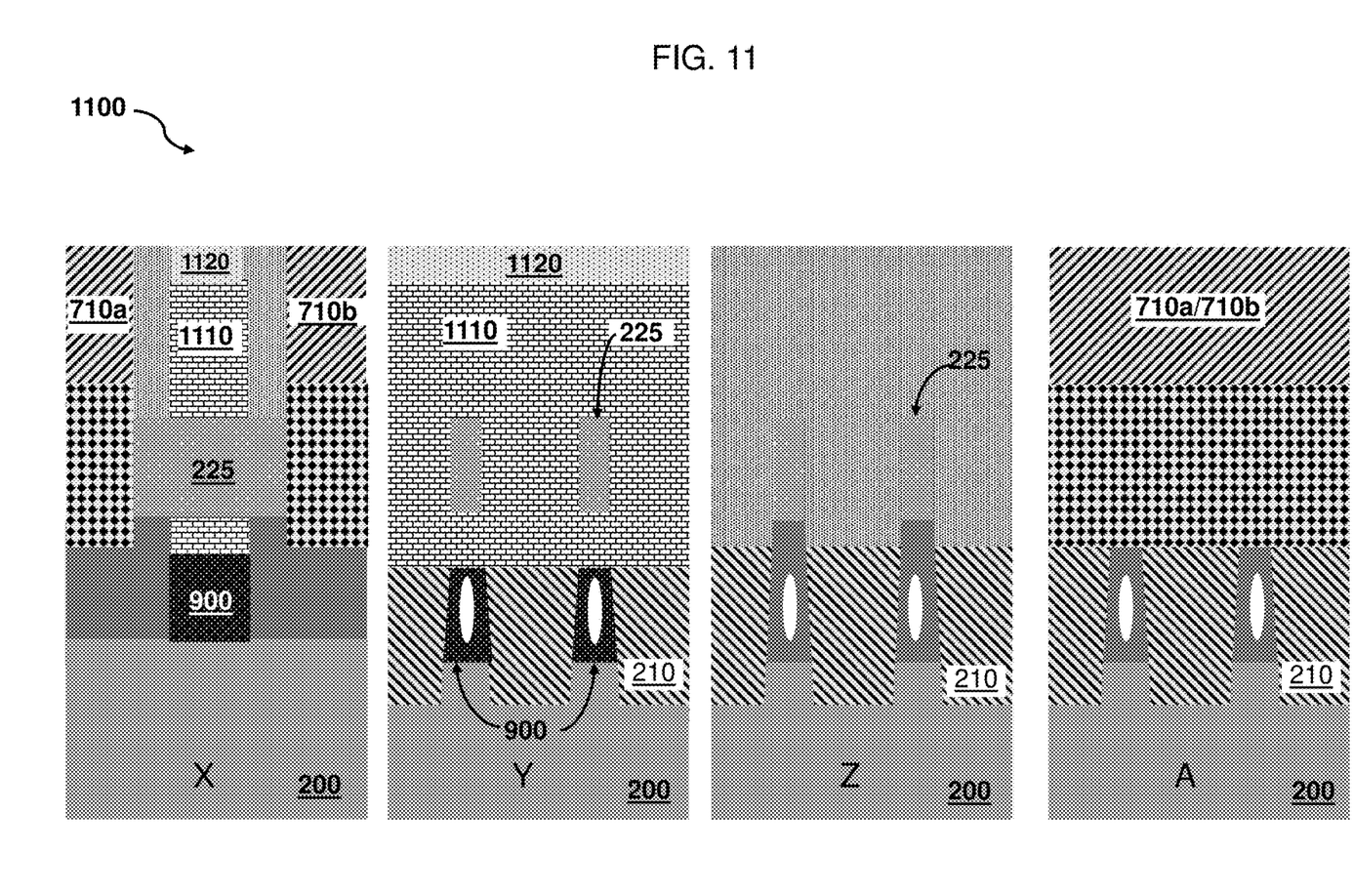
FIG. 11 shows forming a high-k metal gate (HKMG) and optional recessing followed by capping.

As shown in FIG. 11, after forming of second spacer 900, the method of the disclosure may further include forming a high-k metal gate (HKMG) 1110 on the top surface of second spacer 900 and STI layer 210 and around FIN-top 225, such that HKMG 1110 does not touch any portion of substrate 200. HKMG 1110 can comprise various films and can be different for different types of devices (e.g., NFET, PFET, etc.). The high-k dielectric material of HKMG 1110 can be any suitable high-k dielectric material, for example, $HfO_2$ and $ZrO_2$. The metal gate of HKMG 1110 can comprise a work function metal such as TiN, TiC, TiAl, TaN, etc. and can further comprise one or more low resistance conducting metals such as W, Co and Ru.

After HKMG 1110 formation, a planarization process is preferably performed. After planarization, optional recessing of HKMG 1110 can be performed along with optional forming of a gate cap 1120 over recessed HKMG 1110, thereby forming GAA FinFET 1100. FIG. 11 depicts these optional features (recessed HKMG 1110 and gate cap 1120); however, such features are not required by the FAA FinFET of the disclosure. Gate cap 1120 can be formed of one or more of $Si_3N_4$, SiBCN, SiNC, SiN, SiCO, $SiO_2$ and SiNOC. Gate cap 1120 can be formed of the same material or different material from that of gate sidewall spacer 321.

By performing the method of the disclosure, a GAA FinFET can be formed. An example of a GAA FinFET that can be formed is depicted in, for instance, FIG. 11. GAA FinFETs of the disclosure include a substrate having at least one bi-layer fin formed thereon; a shallow trench isolation (STI) layer formed on the substrate and around a portion of a FIN-bottom portion of the bi-layer fin; a high-k metal gate (HKMG) on the top surface of the STI layer and around a FIN-top portion of the bi-layer fin, the HKMG not touching any portion of the substrate and the HKMG having a gate sidewall spacer formed on sidewalls thereof; at least two first spacers composed of a first fill, one first spacer being in the STI layer and not underneath the HKMG and the gate sidewall spacer, another first spacer being in the STI layer and underneath the gate sidewall spacer but not underneath the HKMG; a second spacer composed of a second fill, the second spacer being in the STI layer and underneath the HKMG and the FIN-top portion of the fin, a top surface of the second spacer being in contact with a bottom surface of the HKMG; a source adjacent to a first sidewall of the FIN-top portion and a drain adjacent to a second sidewall of the FIN-top portion, the second sidewall being opposite to the first sidewall, the source and the drain being above the STI layer and the first spacers and not touching any portion of the substrate; a first interlayer dielectric (ILD) layer formed on the source and drain, the first ILD layer having a top surface below a top surface of the HKMG; and a second ILD layer formed on the first ILD layer; wherein a distance separates a top-most surface of the second spacer from a bottom-most surface of the FIN-top portion.

The compositions of the materials, the distance between elements, and the heights of elements within the GAA FinFETs of the disclosure are the same as those mentioned above with respect to the method of the disclosure. However, it is noted that the "first spacer formed in the FIN-void" and the "first spacer formed in the under-FIN cavity" with respect to the method of the disclosure are referred to as the "first spacer not underneath the gate and the gate sidewall spacer" and the "first spacer underneath the gate sidewall spacer but not underneath the gate," respectively, with respect to the GAA FinFET of the disclosure.

As used herein, "depositing" may include any now known or later developed techniques appropriate for the material to be deposited including but not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As used herein, "planarization" or "planarizing" refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than a wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

As used herein, "patterning" typically refers to lithography followed by etching. In "lithography" (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method comprising:
    forming at least one bi-layer fin on a substrate, the substrate having a shallow trench isolation (STI) layer formed thereon and around a portion of a FIN-bottom portion of the bi-layer fin, the fin having a dummy gate formed thereover, the dummy gate having a gate sidewall spacer on sidewalls thereof;
    forming a FIN-void and an under-FIN cavity in the STI layer, the FIN-void including a space created by removing all portions of the fin not underneath the dummy gate and the gate sidewall spacer, the under-FIN cavity including a space created by removing the FIN-bottom portion of the fin underneath the gate sidewall spacer;
    forming at least two first spacers by filling both the under-FIN cavity and the FIN-void with a first fill;
    removing the dummy gate, wherein the FIN-bottom portion and a FIN-top portion of the bi-layer fin underneath the dummy gate are exposed;
    creating an open area underneath the exposed FIN-top portion by removing the exposed FIN-bottom portion; and
    forming a second spacer by filling the open area with a second fill;
    wherein a distance separates a top-most surface of the second spacer from a bottom-most surface of the FIN-top portion.

2. The method of claim 1, wherein the distance that separates the top-most surface of the second spacer from the bottom-most surface of the FIN-top portion is in a range of from about 15 nanometers to about 30 nanometers.

3. The method of claim 1, wherein a height of the first spacer formed in the under-FIN cavity is greater than a height of the first spacer formed in the FIN-void.

4. The method of claim 1, wherein at least one of the first and second spacers have a bottom-most width greater than a top-most width.

5. The method of claim 1, wherein the first fill is a material selected from a group consisting of SiN, SiON, SiBCN and SiOCN.

6. The method of claim 1, wherein the second fill is a material selected from a group consisting of $SiO_2$ and SiCO.

7. The method of claim 1, wherein the second spacer has a height smaller than a height of the first spacer formed in the under-FIN cavity.

8. The method of claim 1, wherein the forming of the at least one bi-layer fin comprises:
    epitaxially growing a FIN-bottom layer on the substrate;
    epitaxially growing a FIN-top layer on the FIN-bottom layer; and
    forming the at least one bi-layer fin by etching the FIN-top layer, the FIN-bottom layer and a portion of the substrate.

9. The method of claim 8, further comprising:
    forming the STI layer by filling spaces around the at least one bi-layer fin with STI material and recessing the STI material to reveal a FIN-top portion of the bi-layer fin and an upper section of the FIN-bottom portion of the bi-layer fin;
    depositing a dummy gate oxide layer on a portion of a top surface of the STI layer, portions of the FIN-bottom portion of the bi-layer fin that are above the top surface of the STI layer, and the FIN-top portion of the bi-layer fin;
    depositing a dummy gate on the dummy gate oxide layer; and
    forming the gate sidewall spacer by depositing a conformal spacer layer on the dummy gate and anisotropically etching the conformal spacer layer.

10. The method of claim 1, wherein the forming of the first spacers comprises:
    filling the FIN-void and the under-FIN cavity with the first fill to form the first spacers; and then
    etching back the first spacers to the top surface of the STI layer and to side surfaces of the gate sidewall spacer.

11. The method of claim 1, wherein after the forming of the first spacers but before the removing of the dummy gate, the method further comprises:
    forming a source adjacent to a first sidewall of the FIN-top portion and a drain adjacent to a second sidewall of the FIN-top portion, the second sidewall being opposite to the first sidewall, the source and the drain being above the STI layer and the first spacers and not touching any portion of the substrate;

forming a first interlayer dielectric (ILD) layer on the source and the drain, wherein a top surface of the first ILD layer is below a top surface of the dummy gate; and forming a second ILD layer on the first ILD layer, wherein the top surface of the dummy gate is exposed through the second ILD layer.

12. The method of claim 1, wherein the forming of the second spacer comprises:

filling the open area with the second fill to form the second spacer, and then etching back the second spacer to the top surface of the STI layer.

13. The method of claim 1, further comprising, after the forming of the second spacer:

forming a high-k metal gate (HKMG) around the FIN-top, the HKMG not touching any portion of the substrate.

* * * * *